(12) United States Patent
Song et al.

(10) Patent No.: US 8,597,756 B2
(45) Date of Patent: Dec. 3, 2013

(54) RESISTANCE HEATED SAPPHIRE SINGLE CRYSTAL INGOT GROWER, METHOD OF MANUFACTURING RESISTANCE HEATED SAPPHIRE SINGLE CRYSTAL INGOT, SAPPHIRE SINGLE CRYSTAL INGOT, AND SAPPHIRE WAFER

(75) Inventors: Do Won Song, Gumi-si (KR); Young Hee Mun, Daegu (KR); Sang Hoon Lee, Daegu (KR); Seong Oh Jeong, Daegu (KR); Chang Youn Lee, Daegu (KR)

(73) Assignee: LG Siltron Inc., Gyeongbuk (KR)

( * ) Notice: Subject to any disclaimer, the term of this patent is extended or adjusted under 35 U.S.C. 154(b) by 63 days.

(21) Appl. No.: 13/354,323

(22) Filed: Jan. 19, 2012

(65) Prior Publication Data
US 2012/0282426 A1 Nov. 8, 2012

(30) Foreign Application Priority Data

Jan. 19, 2011 (KR) .................. 10-2011-0005339

(51) Int. Cl.
*B32B 3/02* (2006.01)
(52) U.S. Cl.
USPC ............ 428/64.1; 117/19; 117/217; 117/950; 423/111; 420/528
(58) Field of Classification Search
USPC ............ 428/64.1; 117/19, 217, 950; 423/111; 420/528
See application file for complete search history.

(56) References Cited

U.S. PATENT DOCUMENTS

2010/0028605 A1* 2/2010 Oshima .................. 428/156

FOREIGN PATENT DOCUMENTS

| JP | 2008-031019 | 2/2008 |
| JP | 2010-120831 | 6/2010 |
| JP | 2010-150052 | 7/2010 |
| KR | 10-2005-0057815 | 6/2005 |

OTHER PUBLICATIONS

Korean application No. 10-2011-0005339, Office Action dated Jan. 31, 2013 with references from Korea Patent Office related to the subject application. (No English Translation provided).
KR PCT Application No. PCT/KR2011/009962 International Search Report dated Sep. 3, 2012.

* cited by examiner

*Primary Examiner* — Elizabeth Mulvaney
(74) *Attorney, Agent, or Firm* — Lewis Roca Rothgerber LLP

(57) ABSTRACT

Provided are a resistance heated sapphire single crystal ingot grower, a method of manufacturing a resistance heated sapphire single crystal ingot, a sapphire single crystal ingot, and a sapphire wafer. The resistance heated sapphire single crystal ingot grower comprises according to an embodiment includes a chamber, a crucible included in the chamber and containing an alumina melt, and a resistance heating heater included inside the chamber and heating the crucible.

14 Claims, 4 Drawing Sheets

RESISTANCE HEATED SAPPHIRE SINGLE CRYSTAL INGOT GROWER, METHOD OF MANUFACTURING RESISTANCE HEATED SAPPHIRE SINGLE CRYSTAL INGOT, SAPPHIRE SINGLE CRYSTAL INGOT, AND SAPPHIRE WAFER

CROSS-REFERENCE TO RELATED APPLICATIONS

The present application claims priority under 35 U.S.C. 119 and 35 U.S.C. 365 to Korean Patent Application No. 10-2011-0005339 filed Jan. 19, 2011, which is hereby incorporated by reference in its entirety.

BACKGROUND

1. Field of the Invention

The present disclosure relates to a resistance heated sapphire single crystal ingot grower, a method of manufacturing a resistance heated sapphire single crystal ingot, a sapphire single crystal ingot, and a sapphire wafer.

2. Description of the Related Art

Demands on sapphire wafers used as a substrate for a light emitting diode (LED) using a nitride semiconductor, e.g., gallium nitride (GaN), have increased and the sapphire wafers are in the spotlight because of high mass productivity in comparison to other substrates.

According to typical techniques, a growth furnace charged with a high-purity alumina ($Al_2O_3$) raw material is heated at about 2100° C. or more to melt the raw material, and a sapphire wafer is then fabricated through performing a series of grinding and polishing processes, such as coring, grinding, slicing, lapping, heat treatment, and polishing, on an ingot boule grown as a single crystal by using various methods such as a Czochralski method (hereinafter, referred to as a "CZ method"), a Kyropoulos method, an edge-defined film-fed growth (EFG) method, and a vertical horizontal gradient freezing (VHGF) method.

A crystallographic orientation of a sapphire substrate currently in mass production having relatively excellent LED light conversion efficiency characteristics is C-axis, and although there is a possibility that the crystallographic orientation thereof may be changed in the future, differences in yields of utilizing single crystals grown according to the growth methods of an ingot boule do not change. The differences in the yields will be depend on physical and chemical properties of a sapphire single crystal and characteristics according to the crystal growth methods.

Meanwhile, with respect to the growth of a sapphire ingot, the CZ method is an excellent method in terms of the yield of a single crystal, in which a crystallographic orientation of a substrate used is the same as a growing orientation of the crystal.

FIG. 1 an exemplary view illustrating a method of manufacturing a sapphire single crystal ingot IG by using a typical induction heated CZ method.

A sapphire ingot grower 10 using a typical CZ method by means of induction heating includes a RF-coil 30, an iridium (Ir) crucible 20, and a crucible support (not shown).

The RF-coil 30 generates induction current on a surface of the Ir-crucible 20 while the direction of high-voltage current flow changes at a radio frequency.

The Ir-crucible 20 generates heat caused by stress on the surface of the crucible due to the changes in the direction of induction current flow and acts as a molten bath containing high-temperature molten alumina ($Al_2O_3$).

However, with respect to a method of growing a c-axis sapphire single crystal ingot by using a typical induction heated CZ method, first, qualities of the sapphire single crystal may deteriorate according to the use of an Ir-crucible in the typical induction heated CZ method, and second, large size and large scaling of the sapphire single crystal ingot may be difficult according to the use of an Ir-crucible in the typical induction heated CZ method, and limiting factors may greatly affect the use of an insulation material and external field resources may not be utilized.

First, limitations in the quality deterioration of the sapphire single crystal according to the use of an Ir-crucible in the typical induction heated CZ method are described below.

In the typical induction heated CZ method, since the Ir-crucible directly generates heat, control of the temperature distribution of high-temperature molten alumina may be difficult and bubbles may be generated by localized heating.

Also, in the typical induction heated CZ method, smooth discharge of the generated bubbles may not be facilitated because free convection (FC) cells are strong as shown in FIG. 1.

In the typical induction heated CZ method, since stress may be generated between a growth interface of a c-axis sapphire single crystal facet surface and a melt while the growth interface becomes convex downward by means of FC cells, crystallographic characteristics, and latent heat effects of high-temperature alumina, crystal defects such as core facets, inclusions, etched pit dislocations (EPD), and striations may be generated.

Also, in the typical CZ method using induction heating, since a free convection cell (FC-cell) caused by the induction heating may exhibit very complex turbulence characteristics (the so-called "Rayleigh-Benard convection") behavior, constant heat and mass transfer at the growth interface may be difficult. Therefore, dislocation density may be very high and the growth of a bubble free perfect single crystal may be difficult.

In the typical induction heated CZ method, changes in the convection cells of a high-temperature alumina melt may not be induced because the Ir-crucible acting as a heating element may not be rotated or lifted.

Further, in the typical induction heated CZ method, the solidification latent heat effect of the growth interface may make the growth interface convex toward the melt due to the FC-cells. As a result, when the grown ingot is strongly rotated, crystal defects may be induced by the application of large shear stress caused by friction according to high viscosities of the growth interface and the melt.

Second, limitations in the difficulties of obtaining large size and large scaling of the sapphire single crystal ingot according to the use of an Ir-crucible in the typical induction heated CZ method, and the limiting factors with respect to the use of an insulation material and limitations of not being able to utilize the external field resources are described below.

For example, iridium, a raw material for the Ir-crucible, is a very limited material, and large size and large scaling of iridium for growing a single crystal having a diameter of 150 mm or more are difficult.

Also, according to the use of a RF-coil, the typical induction heated CZ method has limitations in that maintenance costs of the RF-coil and electricity cost may be large and the fabrication of the RF-coil may be difficult as well as high costs being required.

Further, in the typical induction heated CZ method, since the induction current is generated in a magnetic field coil in addition to the crucible, the external field resources such as magnetic field and electromagnetic field may not be utilized.

SUMMARY OF THE CLAIMED INVENTION

Embodiments provide a resistance heated sapphire single crystal ingot grower that may improve qualities of a sapphire single crystal by overcoming the control limits of a typical induction heated CZ method with respect to the convection cells of a high-temperature alumina ($Al_2O_3$) melt, a method of manufacturing a resistance heated sapphire single crystal ingot, a sapphire single crystal ingot, and a sapphire wafer.

Embodiments also provide a resistance heated sapphire single crystal ingot grower, in which a large diameter may be obtained, costs may be reduced, and efficiency may increase, a method of manufacturing a resistance heated sapphire single crystal ingot, a sapphire single crystal ingot, and a sapphire wafer.

In one embodiment, a resistance heated sapphire single crystal ingot grower comprises: a chamber; a crucible included in the chamber and containing an alumina melt; and a resistance heating heater included inside the chamber and heating the crucible.

In another embodiment, a method of manufacturing a resistance heated sapphire single crystal ingot comprises: charging polycrystalline alumina into a crucible included in a chamber; heating the crucible by a resistance heating heater to make the polycrystalline alumina as an alumina melt; contacting a seed crystal with an upper portion of the molten alumina; growing a sapphire single crystal ingot from the seed crystal; and separating the grown ingot from the molten alumina.

In further another embodiment, a sapphire ingot may have a diameter of about 150 mm or more.

In still further another embodiment, a sapphire wafer may have a diameter of about 150 mm or more.

The details of one or more embodiments are set forth in the accompanying drawings and the description below. Other features will be apparent from the description and drawings, and from the claims.

DETAILED DESCRIPTION

Figure 1:
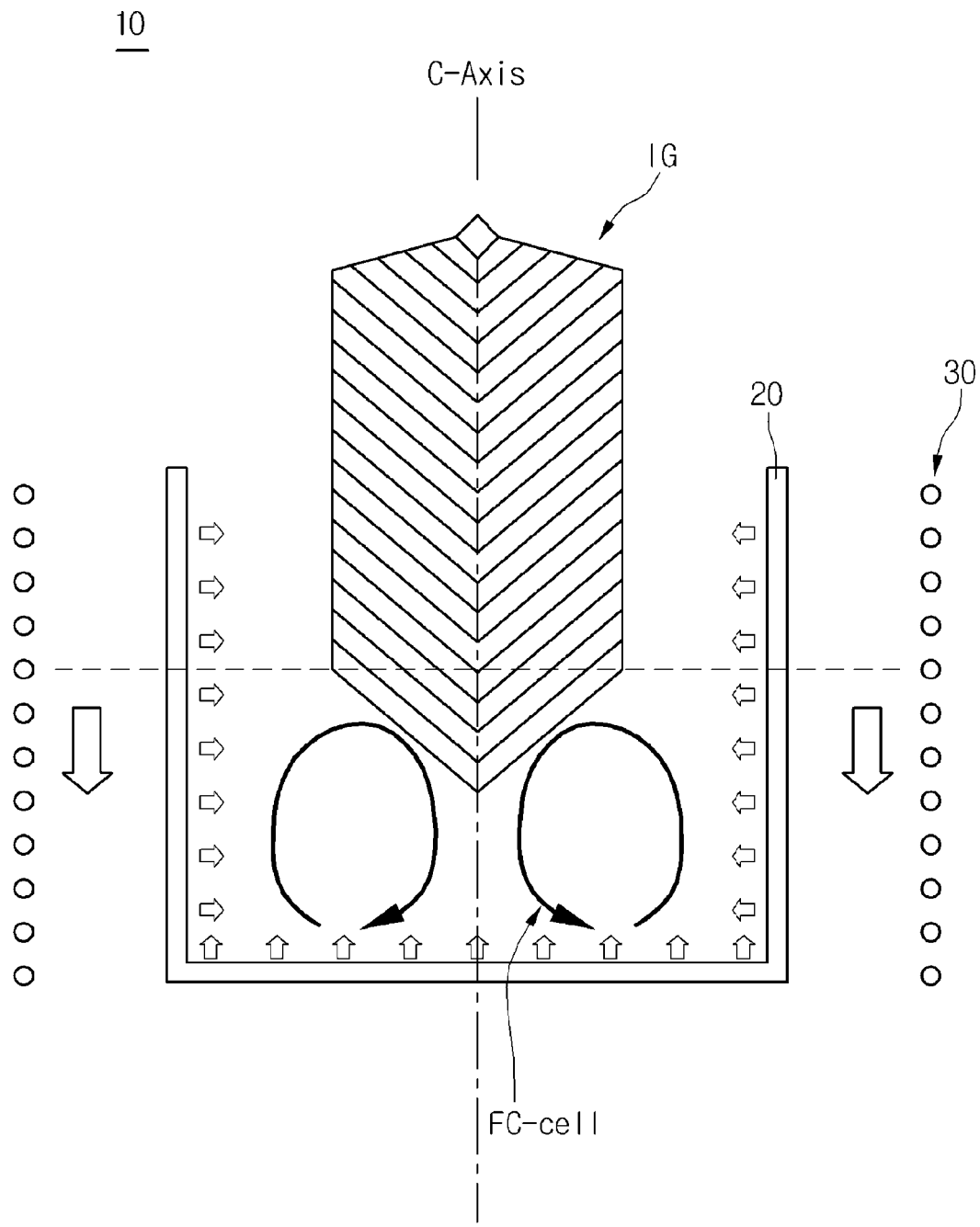
FIG. 1 is an exemplary view illustrating a method of manufacturing a sapphire single crystal ingot by using a typical induction heated Czochralski method.

In the description of embodiments, it will be understood that when a wafer, apparatus, chuck, member, part, region or plane is referred to as being "on" and "under" another wafer, apparatus, chuck, member, part, region or plane, the terminology of "on" and "under" includes both the meanings of "directly" and "indirectly". Further, the reference about "on" and "under" each element will be made on the basis of drawings.

Since the thickness or size of each element in the drawings may be modified for convenience in description and clarity, the size of each element does not entirely reflect an actual size.

Embodiment

Figure 2:
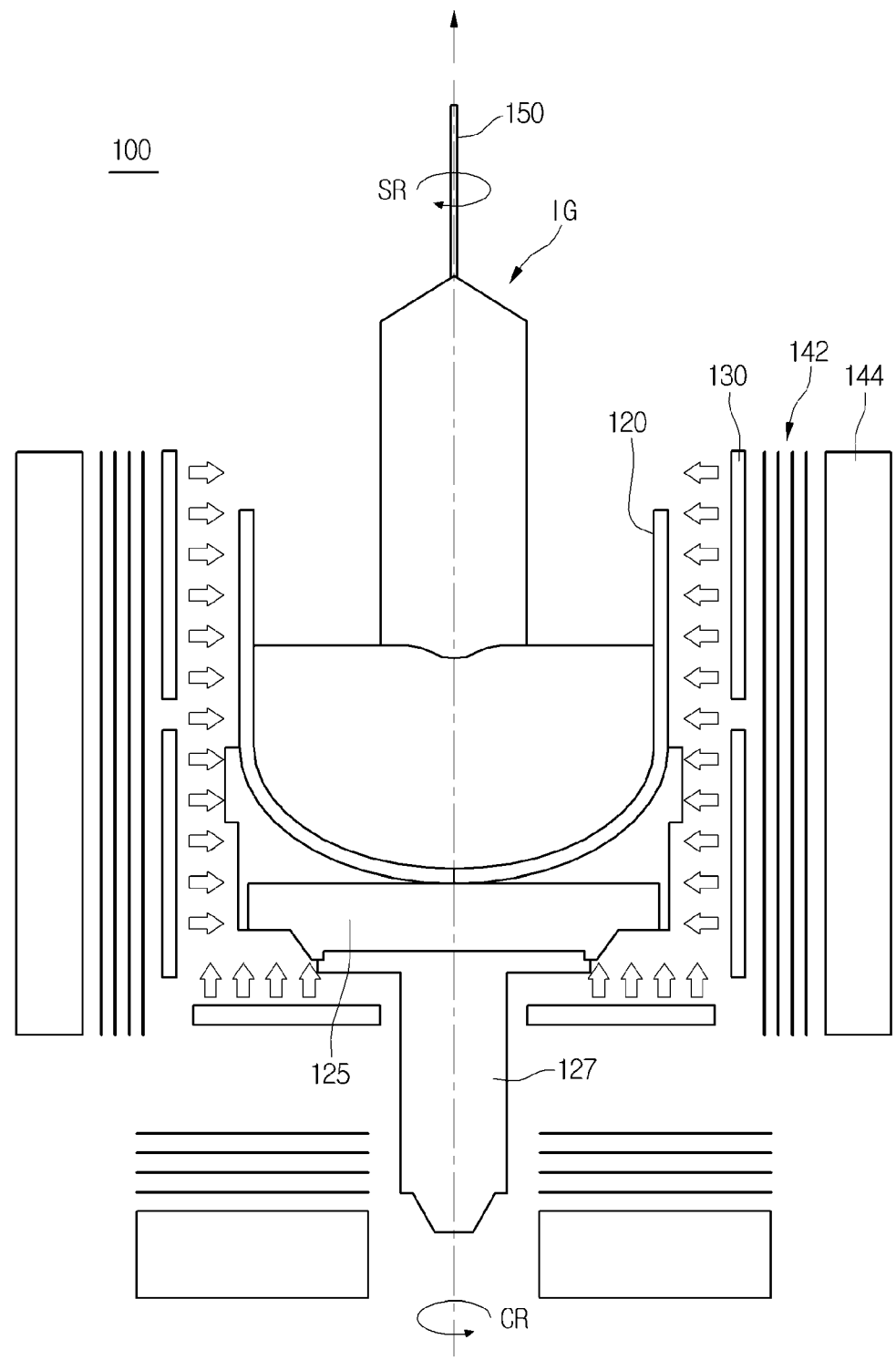
FIG. 2 is an exemplary view illustrating a resistance heated sapphire single crystal ingot grower according to an embodiment.

FIG. 2 is an exemplary view illustrating a resistance heated sapphire single crystal ingot grower 100 according to an embodiment.

The embodiment may use a Czochralski method, in which a single crystal seed is dipped in an alumina melt and a crystal is then grown by slowly pulling thereof, as a method of manufacturing a sapphire single crystal ingot.

The resistance heated sapphire single crystal ingot grower 100 according to the embodiment may include a chamber (not shown), a crucible 120 included in the chamber and containing an alumina melt, a resistance heating heater 130 included inside the chamber and heating the crucible 120, an after heater (not shown) preheating a growing ingot, and a pulling means 150 in which a seed S (see FIG. 3) is combined at one end thereof.

The chamber provides a space, in which predetermined processes for growing a sapphire ingot IG are performed.

The crucible 120 is included in the chamber so as to contain the alumina melt and may be formed of tungsten (W) or molybdenum (Mo), but the crucible 120 is not limited thereto.

Material and shape of the crucible 120 in the embodiment may be designed to be fitted in a diameter of 150 mm or more, and accordingly, conduction and the convection and heat transfer mechanism of the melt may be controlled.

A crucible support 125 may be included outside the crucible 120 so as to support the crucible 120. The crucible support 125 is fixed and installed on a rotational axis 127, and the rotational axis 127 may provide a level stationary solid-liquid interface while being rotated by a driving means (not shown) to make rotation and up-down movements of the crucible 120.

The resistance heating heater 130 may be included in the chamber in order to heat the crucible 120.

The resistance heating heater 130 melts polycrystalline sapphire bulks charged into the crucible 120 to make a sapphire melt.

The resistance heating heater 130 may be formed of graphite (C), tungsten, or molybdenum, but the resistance heating heater 130 is not limited thereto.

A multiple heating heater may be used as the resistance heating heater 130 and the resistance heating heater 130 may be designed to be fitted in a diameter of 300 mm.

A radiation insulator 142 may be installed inside the chamber in order that heat of the resistance heating heater 130 is not released. Material and shape of the insulator 142 may be designed to be able to obtain optimum thermal distributions of the resistance heating heater 130 and the crucible 120 and use the energy thereof with minimum loss.

Also, in the embodiment, a heat shield 144 is further included outside the insulator 142 such that the release of heat toward the outside of the chamber may be prevented. The installation sequence of the radiation insulator 142 and the heat shield 144 installed inside the chamber may be changed according to the materials thereof. Further, the radiation insulator 142 and the heat shield 144 are not limited to be arranged at a side portion of the chamber based on the crucible, but the radiation insulator 142 and the heat shield 144 may also be positioned at lower and upper portions thereof.

The resistance heated sapphire single crystal ingot grower 100 according to the embodiment may include a seed driving unit, a sensor unit, and a control unit.

The seed driving unit plays an important role in the movement of the resistance heated sapphire single crystal ingot grower 100 and may include a pulling means 150 capable of seed rotation and seed lift movements and a control logic.

The sensor unit functions to receive and send various electrical and mechanical signals in the operation of the resistance heated sapphire single crystal ingot grower 100, and may include a sensor part capable of weight sensing of an ingot and temperature sensing of a side surface of the ingot and a control logic.

The control unit is a control logic performing actual crystal growth based on the various types of information from the driving unit and the sensor unit. The control unit may be designed as a closed-loop type feedback control logic linking weight and temperature, but the control unit is not limited thereto.

According to the embodiment, optimum thermal distribution may be obtained by designing a hot zone (H/Z) appropriate for a designed apparatus. For example, computer simulation for developing the hot zone is performed in the embodiment, and an H/Z material may be effectively selected by estimating the convection and heat transfer characteristics of the melt based on the computer simulation.

Also, the embodiment may use an after heating technique, but the embodiment is not limited thereto. For example, a reflection unit (not shown) may be included at an upper side of the sapphire ingot for after heating, but the reflection unit is not limited thereto.

Further, the embodiment may perform an annealing process for removing dislocations in an as-grown ingot, but the embodiment is not limited thereto.

Figure 3:
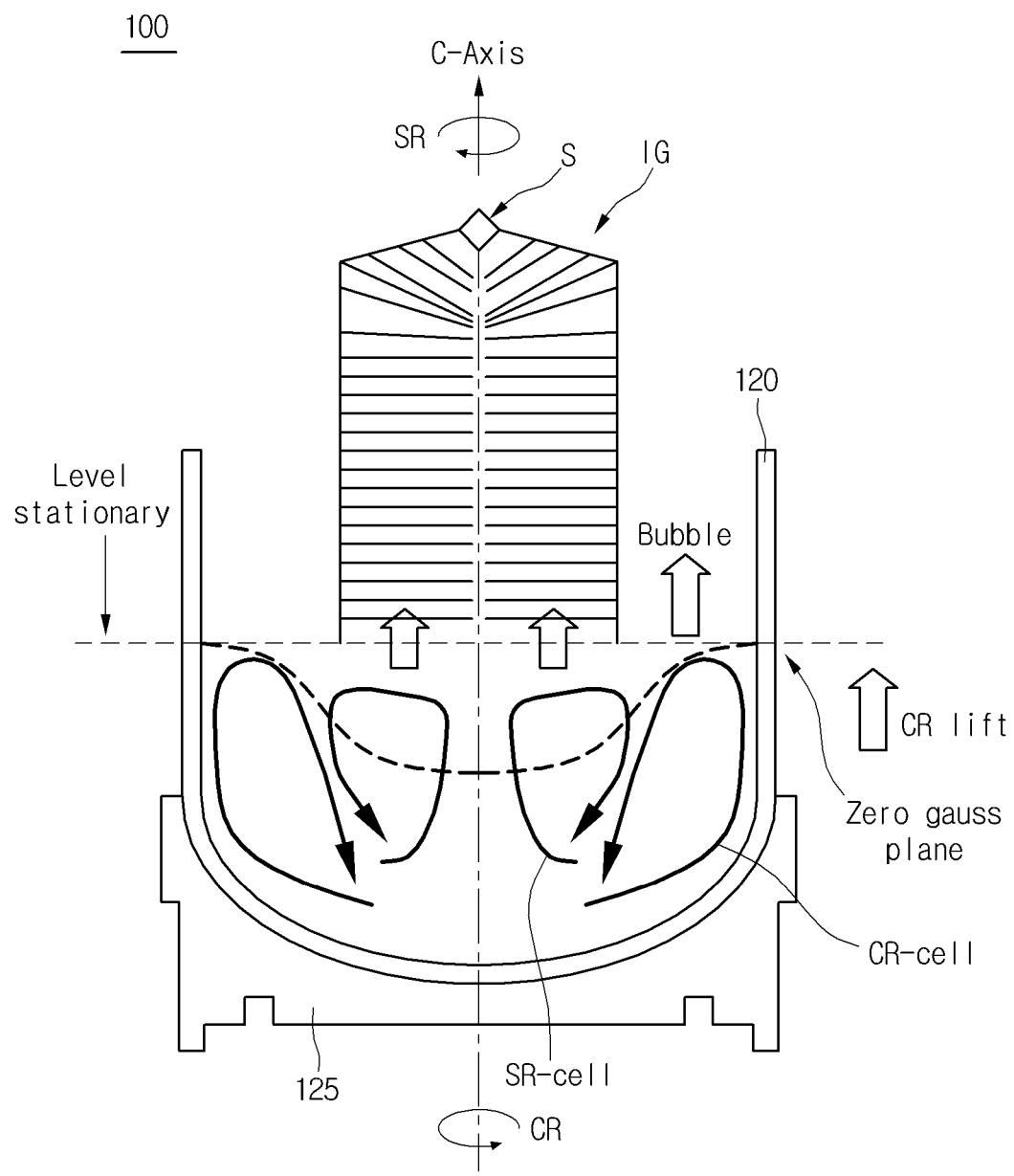
FIG. 3 is an exemplary view illustrating control with respect to convection cells and a control method with respect to a transfer phenomenon of an growth interface of a high-temperature alumina melt by using a resistance heated Czochralski method according to an embodiment.
Figure 4:
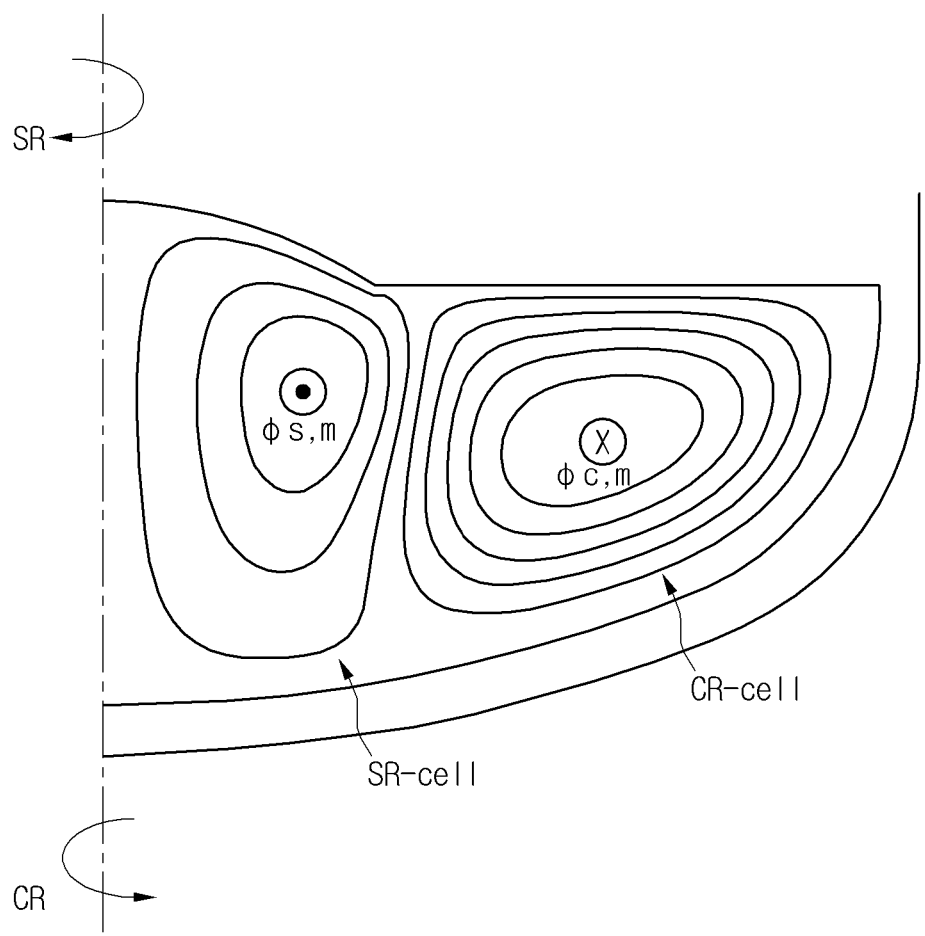
FIG. 4 is an exemplary view illustrating a method of interpreting convection cells in a method of manufacturing a sapphire single crystal ingot by using the resistance heated Czochralski method according to the embodiment.

FIG. 3 is an exemplary view illustrating control with respect to convection cells and a control method with respect to a transfer phenomenon of an growth interface of a high-temperature alumina melt by using a resistance heated Czochralski method according to an embodiment, and FIG. 4 is an exemplary view illustrating a method of interpreting convection cells in a method of manufacturing a sapphire single crystal ingot by using the resistance heated Czochralski method according to the embodiment.

According to the resistance heated sapphire single crystal ingot grower and the method of manufacturing a resistance heated sapphire single crystal ingot of the embodiment, qualities of a sapphire single crystal may be improved by overcoming control limitations with respect to the convection cells of a high-temperature alumina ($Al_2O_3$) melt.

For example, according to the embodiment, etched pit dislocation (EPD) density may be greatly decreased by means of a transfer phenomenon at a growth interface through a resistance heating method and crucible rotation.

In particular, the embodiment may induce a forced convection effect by rotating the crucible 120 and the single crystal ingot IG at an appropriate ratio, in order to overcome the limitations of the related art in controlling the convection cells of the high-temperature alumina melt, and the temperature in the melt is uniformly distributed by effectively maintaining the generated forced convection cells through field resources and crucible 120 lift and at the same time, accumulated latent heat may be effectively released toward the ingot through the growth interface by making the shape of the growth interface flat or convex toward the ingot. As a result, according to the embodiment, etched pit dislocations generated due to pulling and temperature gradient may be greatly reduced.

For example, according to the embodiment, the density of the etched pit dislocations may be decreased in an amount of 1000 EA/$cm^2$ or less.

Also, according to the embodiment, bubbles in the single crystal ingot are decreased by means of the deceleration of natural convection and forced convection effect by inducing partial deceleration of natural convection and partial forced convection, and thereby, a bubble free perfect sapphire ingot may be provided.

In particular, in the embodiment, a ratio of angular momentums of the melts participating in angular rotations may be constantly maintained while rotating the crucible 120 and the sapphire ingot IG in opposite directions, and finally, high-temperature alumina containing bubbles moves to a free surface by being included in a crucible rotation cell (hereinafter, referred to as "CR-Cell") vertically rising along a wall of the crucible 120. At this time, the bubbles may be evaporated due to the low pressure in a growing furnace.

Remaining micro-bubbles may not move to the growth interface due to a pumping effect of a seed rotation cell (hereinafter, referred to as "SR-Cell") according to the rotation of the ingot IG.

$$DS\ ratio = \text{volume of seed rotation cell/volume of crucible rotation cell} = V_s/V_c \quad \text{[Equation 1]}$$

Where, the DS ratio is a ratio of the volume of the SR-cell to the volume of the CR-cell.

$$M_sM_c = \text{angular momentum of seed rotation cell/angular momentum of crucible rotation cell} = V_s\Phi_{s,m}/V_c\phi_{c,m} \quad \text{[Equation 2]}$$

Where, MsMc is a ratio of the angular momentum of the SR-cell to the angular momentum of the CR-cell, $\Phi_{s,m}$ is a maximum angular velocity at the center of the SR-cell, and $\Phi_{c,m}$ is a maximum angular velocity at the center of the CR-cell.

In the embodiment, partial deceleration of natural convection and partial forced convection are induced by deriving optimum conditions of an MsMc value, and thus, bubbles in the single crystal ingot may be decreased.

Also, according to the embodiment, core facets may not be generated by shear stress due to the friction between the growth interface and the melt and stress control according to the changes in the discharge path of latent heat.

In particular, according to the embodiment, the growth interface may be controlled to have a form that is flat or convex toward a growing crystal from a form that is convex toward the melt due to the pumping effect caused by the SR-cell according to the rotation of the ingot IG. This may change an angle between the shear stress acting at an interface between the growth interface and the melt and a facet direction, and thus, may advantageously act to control the core facets.

Further, according to the embodiment, cracks in the ingot may be decreased by controlling the temperature distribution of the grown ingot IG.

In particular, according to the embodiment, the level stationary position of the solid-liquid interface may be obtained by allowing the crucible 120 to CR lift through adjustment to a density ratio of the grown crystal. As a result, changes in the positions of the center of the resistance heating heater 130 and the growth interface are minimized to minimize the changes in the thermal distribution of the ingot IG in the growing furnace. Therefore, the generation of the cracks, which may be generated in the growing crystal due to the differences in thermal stress distribution, may be prevented. Meanwhile, the thermal distribution of the ingot IG may be effectively controlled by using an after heater.

Also, according to the embodiment, a sapphire ingot having a large diameter may be obtained, and a resistance heated sapphire single crystal ingot grower capable of reducing costs and increasing efficiency, a method of manufacturing a resistance heated sapphire single crystal ingot, a sapphire single crystal ingot, and a sapphire wafer may be provided.

For example, according to the embodiment, manufacturing of a sapphire ingot having a large diameter is facilitated in comparison to a typical RF-coil induction heated CZ method, and therefore, a sapphire ingot having a diameter of 150 mm or more and a sapphire wafer may be provided. Also, the embodiment may provide a sapphire ingot having an effective length of 200 mm or more and a diameter of 150 mm or more.

According to the embodiment, crystal growing techniques in all other directions (A-axis, R-axis, and M-axis) may be established according to the establishment of a crystallographic C-axis growing technique with respect to a sapphire single crystal. That is, although a crystallographic direction required for a sapphire substrate for LED is changed, a technique able to instantaneously correspond thereto may be secured.

When the C-axis growing technique is developed according to the embodiment, ingots may be produced by grinding without performing a coring process, which is necessary for the other growing methods, and thus, a technique having internationally unparalleled competitiveness may be secured by establishing a high cylinder yield of 50% or more through diameter control as well as the improvement of productivity.

The ingot cylinder yield (%) may be obtained by dividing the weight of the ingot cylinder by the weight of an ingot boule and multiplying 100.

According to the embodiment, sapphire ingot and sapphire wafer having no twin/sub-grain boundaries may be provided.

Also, according to the embodiment, a sapphire ingot having an orientation range of target±0.025' and flat±0.1' based on the ingot cylinder may be provided.

According to the embodiment, costs for subsidiary materials may be significantly reduced due to the unemployment of an Ir-crucible.

Further, according to the embodiment, effects of research and development may be increased because wide control limits may be obtained in terms of the selection of the insulator and the utilization of process variables.

For example, shapes and positions of a boundary layer and a SR-cell near the growth interface may be controlled by using a field resource cusp magnet and a Lorentz force generated according to the behavior of the high-temperature melt.

For example, according to the embodiment, when a ratio of currents applied to an upper coil and a lower coil of a magnet device is adjusted, a zero gauss plane is lowered from about 40 mm to about 105 mm and the Lorentz force of the SR-cell is increased. For example, the zero gauss plane may be lowered and the Lorentz force of the SR-cell may be increased by adjusting the ratio of the currents applied to the upper and lower coils in a range of 1 to 2, but the embodiment is not limited thereto. The phrase "the ratio of the currents applied to the upper and lower coils is in a range of 1 to 2" may denote that the currents of the both coils are the same (1:1) or the current of any one coil is twice of that of the other. For example, the ratio of the currents applied to the upper coil and the lower coil may be in a range of 1:0.5 to 1:2, but the current ratio is not limited thereto.

When the amount of pumping is increased by an increase in the Lorentz force according to the embodiment, oxygen introduced from the bottom of the crucible is increased to increase the concentration of oxygen in the sapphire ingot.

The following effects may be obtained according to the resistance heated sapphire single crystal ingot grower, the method of manufacturing a resistance heated sapphire single crystal ingot, the sapphire single crystal ingot, and the sapphire wafer of the embodiment.

According to the embodiment, first, a resistance heated sapphire single crystal ingot grower capable of improving qualities of a sapphire single crystal by overcoming control limits with respect to a high-temperature alumina melt, a method of manufacturing a resistance heated sapphire single crystal ingot, a sapphire single crystal ingot, and a sapphire wafer may be provided.

For example, according to the embodiment, etched pit dislocation density may be greatly reduced by means of a transfer phenomenon at a growth interface through a resistance heating method and crucible rotation. Also, according to the embodiment, bubbles in the single crystal ingot are decreased by means of the effects of the partial deceleration of natural convection and partial forced convection, and thereby, a bubble free perfect sapphire ingot may be provided. According to the embodiment, core facets may not be generated by shear stress due to the friction of the growth interface and stress control according to the changes in the discharge path of latent heat. Further, according to the embodiment, cracks in the ingot may be decreased by controlling the temperature distribution of the grown ingot.

Second, according to the embodiment, a resistance heated sapphire single crystal ingot grower capable of obtaining a large diameter, reducing costs and increasing efficiency, a method of manufacturing a resistance heated sapphire single crystal ingot, a sapphire single crystal ingot, and a sapphire wafer may be provided.

For example, according to the embodiment, manufacturing of a sapphire ingot having a large diameter is facilitated in comparison to a typical RF-coil induction heated CZ method, and therefore, a sapphire ingot having a diameter of 150 mm or more and a sapphire wafer may be provided. Also, the embodiment may provide a sapphire ingot having an effective length of 200 mm or more and a diameter of 150 mm or more.

Further, according to the embodiment, crystal growing techniques in all other directions (A-axis, R-axis, and M-axis) may be established according to the establishment of a crystallographic C-axis growing technique with respect to a sapphire single crystal. When the C-axis growing technique is developed according to the embodiment, ingots may be produced by grinding without performing a coring process, which is necessary for the other growing methods, and thus, a technique having internationally unparalleled competitiveness may be secured by establishing a high cylinder yield of 50% or more through diameter control as well as the improvement of productivity.

According to the embodiment, costs for subsidiary materials may also be significantly reduced due to the unemployment of an Ir-crucible. Further, according to the embodiment, effects of research and development may be increased because wide control limits may be obtained in terms of the selection of the insulator and the utilization of process variables.

Meanwhile, sapphire is a potential material having great possibilities of being applied to various industrial sectors such as telecommunication, sensors, and security in addition to light emitting diode (LED), and the development of new products for developing other application markets may be possible by establishing a high-quality large diameter sapphire material technique having high productivity through the techniques of the embodiment.

Features, structures, or effects described in the foregoing embodiment are included in at least one embodiment of the present invention, and are not necessarily limited to only one embodiment thereof. Further, the features, structures, or effects exemplified in each embodiment may be combined or modified by those skilled in the art and implemented to other embodiments thereof. Therefore, descriptions related to such combinations and modifications will be construed as being included in the scope of the present invention.

Also, while this invention has been particularly shown and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A method of manufacturing a resistance heated sapphire single crystal ingot, the method comprising:
   charging polycrystalline alumina into a crucible included in a chamber;
   heating the crucible by a resistance heating heater to make the polycrystalline alumina as an alumina melt;
   a cusp magnet applying a magnetic field to the alumina melt in the crucible;
   contacting a seed crystal with an upper portion of the molten alumina;
   growing a sapphire single crystal ingot from the seed crystal; and
   separating the grown ingot from the molten alumina,
   wherein a zero gauss plane is lowered and a Lorentz force of a seed rotation cell (SR-cell) is increased by adjusting a ratio of currents applied to an upper coil and a lower coil of the cusp magnet in a range of about 1:0.5 to about 1:2.

2. The method according to claim 1, further comprising:
   a crucible support included outside the crucible; and
   a rotational axis included under the crucible support,
   wherein the rotational axis rotates and moves up and down the crucible by means of a predetermined driving means.

3. The method according to claim 1, wherein a convection cell of the alumina melt is controlled by rotating the growing crystal and the crucible.

4. The method according to claim 3, wherein MsMc is maintained in a range of 0.1 to 0.5 by using the following Equations 1 and 2;

$$DS\ \text{ratio} = \text{volume of seed rotation cell/volume of crucible rotation cell} = Vs/Nc \text{ where the } DS \text{ ratio is a ratio of the volume of the } SR\text{-cell to the volume of the crucible rotation cell}(CR\text{-cell});$$ [Equation 1]

$$MsMc = \text{angular momentum of seed rotation cell/angular momentum of crucible rotation cell} = Vs < Ps, mNc < Pc, m \text{ where } MsMc \text{ is a ratio of the angular momentum of the } SR\text{-cell to the angular momentum of the } CR\text{-cell}, < Ps, m \text{ is a maximum angular velocity at a center of the } SR\text{-cell, and } < Pc, m \text{ is a maximum angular velocity at a center of the } CR\text{-cell}.$$ [Equation 2]

5. The method according to claim 1, further comprising heating a growing ingot with an after heater.

6. A sapphire ingot manufactured by the method according to claim 1, wherein the sapphire ingot has a diameter of about 150 mm or more.

7. The sapphire ingot according to claim 6, wherein the sapphire ingot has a diameter of about 150 mm or more and an effective length of about 200 mm or more.

8. The sapphire ingot according to claim 6, wherein the sapphire ingot has an etched pit dislocation (EPD) density of about 1000 EA/cm2 or less.

9. The sapphire ingot according to claim 6, wherein the sapphire ingot is bubble free.

10. The sapphire ingot according to claim 6, wherein a core facet is not generated.

11. A sapphire wafer manufactured by the method according to claim 1, wherein the sapphire wafer has a diameter of about 150 mm or more manufactured from a sapphire ingot.

12. The sapphire wafer according to claim 11, wherein the sapphire wafer has an etched pit dislocation (EPD) density of about 1000 EA/cm2 or less.

13. The sapphire wafer according to claim 11, wherein the sapphire wafer is bubble free.

14. The sapphire wafer according to claim 11, wherein a core facet is not generated.

* * * * *